US010217639B1

(12) United States Patent
Lee et al.

(10) Patent No.: US 10,217,639 B1
(45) Date of Patent: Feb. 26, 2019

(54) METHOD OF FORMING DRAIN EXTENDED MOS TRANSISTORS FOR HIGH VOLTAGE CIRCUITS

(71) Applicant: CYPRESS SEMICONDUCTOR CORPORATION, San Jose, CA (US)

(72) Inventors: Sungkwon Lee, Saratoga, CA (US); Igor G. Kouznetsov, San Francisco, CA (US); Gyu-Chul Kim, Lakeville, MN (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/842,326

(22) Filed: Sep. 1, 2015

Related U.S. Application Data

(63) Continuation of application No. 14/108,967, filed on Dec. 17, 2013, now Pat. No. 9,123,642.

(60) Provisional application No. 61/857,151, filed on Jul. 22, 2013.

(51) Int. Cl.
*H01L 29/66* (2006.01)
*H01L 21/266* (2006.01)

(52) U.S. Cl.
CPC ...... *H01L 21/266* (2013.01); *H01L 29/66681* (2013.01)

(58) Field of Classification Search
CPC ............... H01L 29/66659; H01L 29/66; H01L 29/7835
See application file for complete search history.

(56) References Cited

U.S. PATENT DOCUMENTS

| | | |
|---|---|---|
| 5,047,358 A | 9/1991 | Kosiak et al. |
| 5,242,841 A | 9/1993 | Smayling et al. |
| 5,254,487 A | 10/1993 | Tamagawa |
| 5,498,554 A | 3/1996 | Mei |
| 5,501,994 A | 3/1996 | Mei |
| 5,541,125 A | 7/1996 | Williams et al. |
| 5,911,104 A | 6/1999 | Smayling et al. |
| 6,153,916 A | 11/2000 | Roth et al. |
| 6,297,108 B1 | 10/2001 | Chu |
| 6,803,282 B2 | 10/2004 | Mitros et al. |
| 7,005,354 B2 | 2/2006 | Pan et al. |
| 7,235,451 B2 | 6/2007 | Hao et al. |

(Continued)

OTHER PUBLICATIONS

USPTO Non-Final Rejection for U.S. Appl. No. 14/108,967 dated Dec. 5, 2014; 10 pages.

(Continued)

*Primary Examiner* — Jae Lee

(57) ABSTRACT

A device including both drain extended metal-on-semiconductor (DE_MOS) and low-voltage metal-on-semiconductor (LV_MOS) transistors and methods of manufacturing the same are provided. In one embodiment, the method includes implanting ions of a first-type at a first energy level in a drain portion of a first DE_MOS transistor in a DE_MOS region of a substrate to form the first DE_MOS transistor, and implanting ions of the first-type at a second energy level in a LV_MOS region of the substrate adjust a voltage threshold of a first LV_MOS transistor, while concurrently implanting ions of the first-type at the second energy level in the drain portion of the first DE_MOS transistor to form a drain extension of the first DE_MOS transistor. Other embodiments are also provided.

17 Claims, 12 Drawing Sheets

(56) References Cited

U.S. PATENT DOCUMENTS

| | | |
|---|---|---|
| 7,268,394 B2 | 9/2007 | Hao et al. |
| 7,427,795 B2 | 9/2008 | Pendharkar |
| 7,592,661 B1 | 9/2009 | Lee et al. |
| 7,618,870 B2 | 11/2009 | Pan et al. |
| 7,659,558 B1 | 2/2010 | Walker et al. |
| 7,667,241 B1 | 2/2010 | Walker et al. |
| 7,768,068 B1 | 8/2010 | Jang et al. |
| 7,781,843 B1 | 8/2010 | Weaver et al. |
| 7,838,937 B1 | 11/2010 | Walker et al. |
| 8,143,673 B1 | 3/2012 | Walker et al. |
| 8,173,500 B2 | 5/2012 | Jun |
| 8,283,727 B1 | 10/2012 | Walker et al. |
| 2010/0044789 A1* | 2/2010 | Lotfi .................. H01L 21/761 257/336 |
| 2011/0266626 A1 | 11/2011 | Herberholz et al. |
| 2012/0193709 A1* | 8/2012 | Sukegawa ....... H01L 21/823807 257/337 |
| 2012/0280292 A1 | 11/2012 | Bjoerk et al. |

OTHER PUBLICATIONS

USPTO Non-Final Rejection for U.S. Appl. No. 14/108,967 dated Mar. 27, 2014; 8 pages.
USPTO Notice of Allowance for U.S. Appl. No. 14/108,967 dated Apr. 30, 2015; 9 pages.
USPTO Notice of Allowance for U.S. Appl. No. 14/108,967 dated Oct. 7, 2014; 8 pages.

* cited by examiner

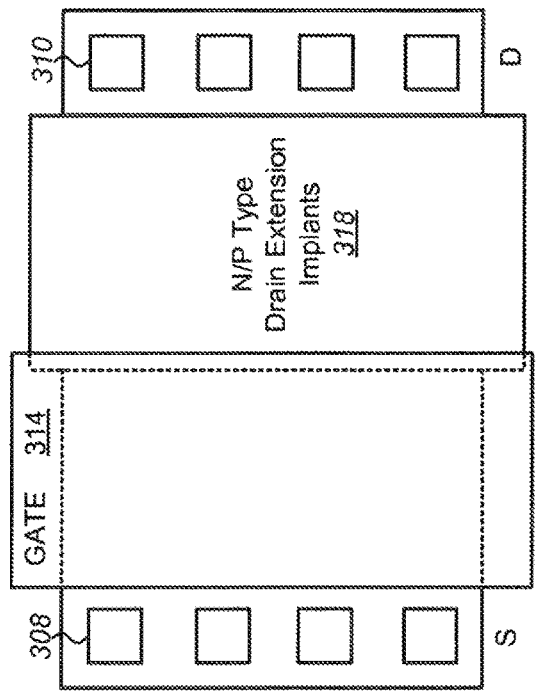
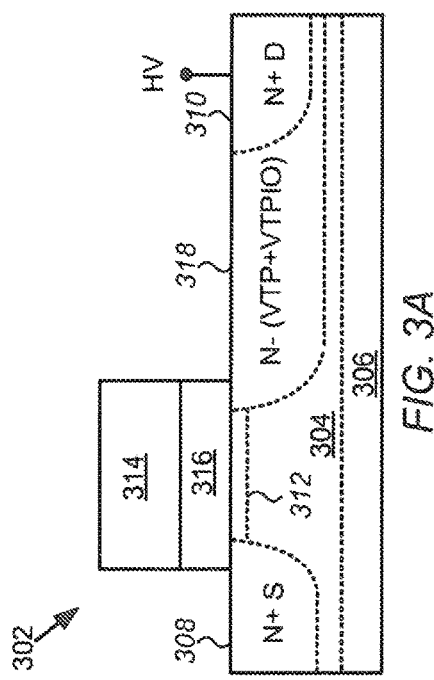
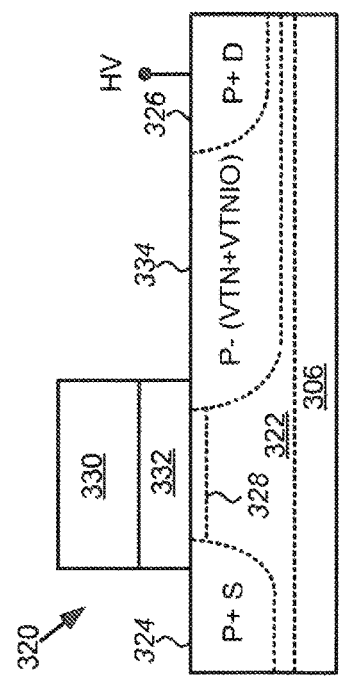
FIG. 3A
FIG. 3B
FIG. 3C

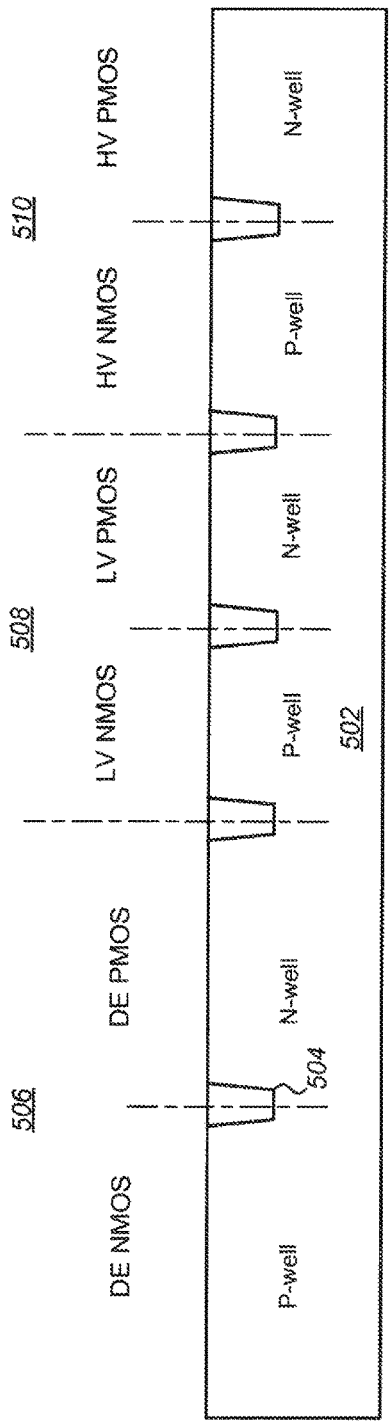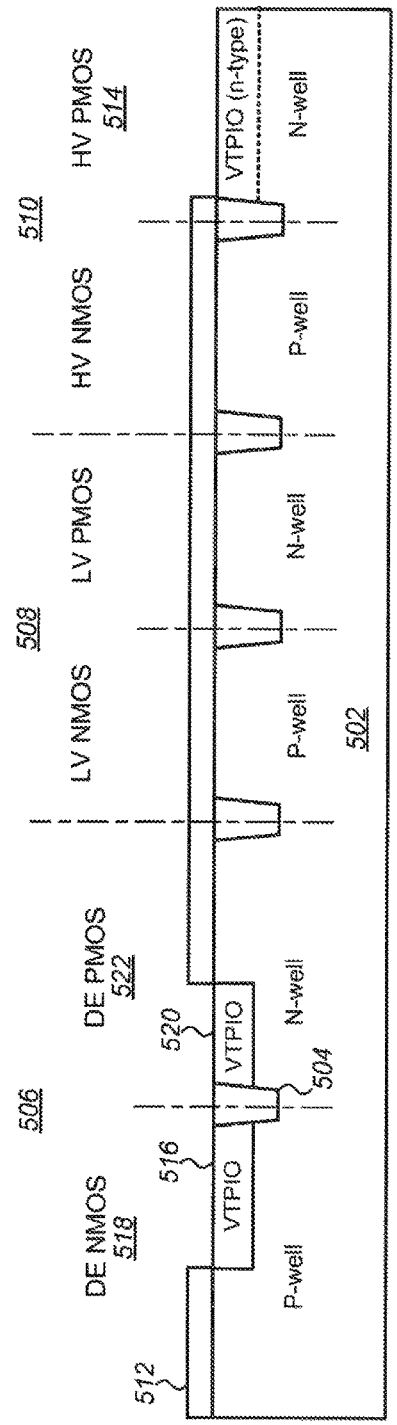

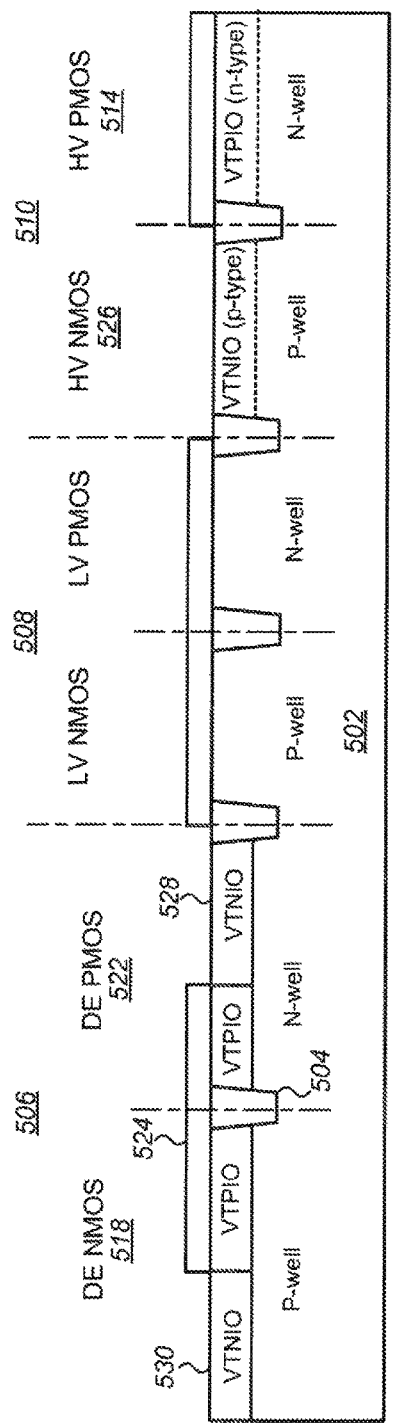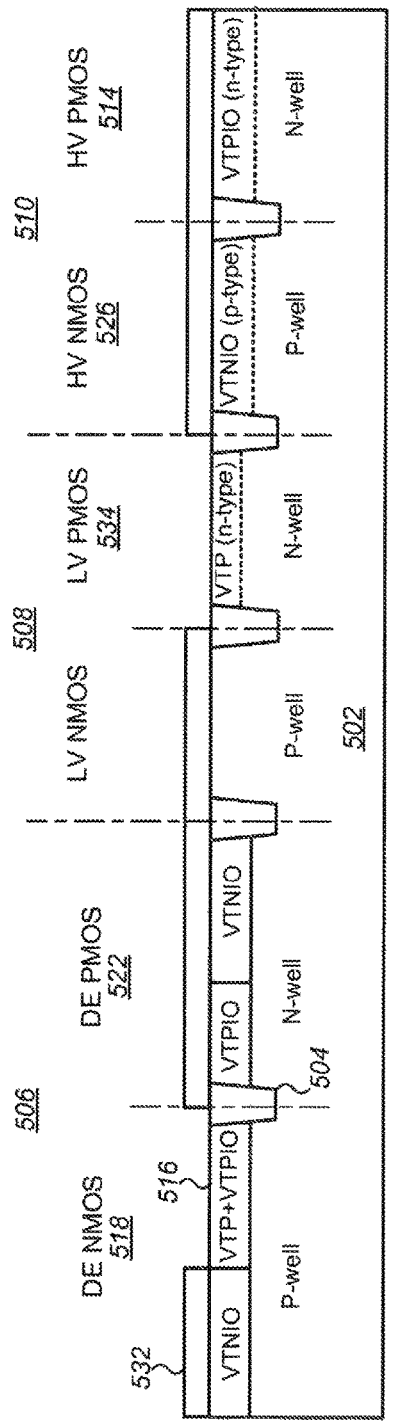
FIG. 5C
FIG. 5D

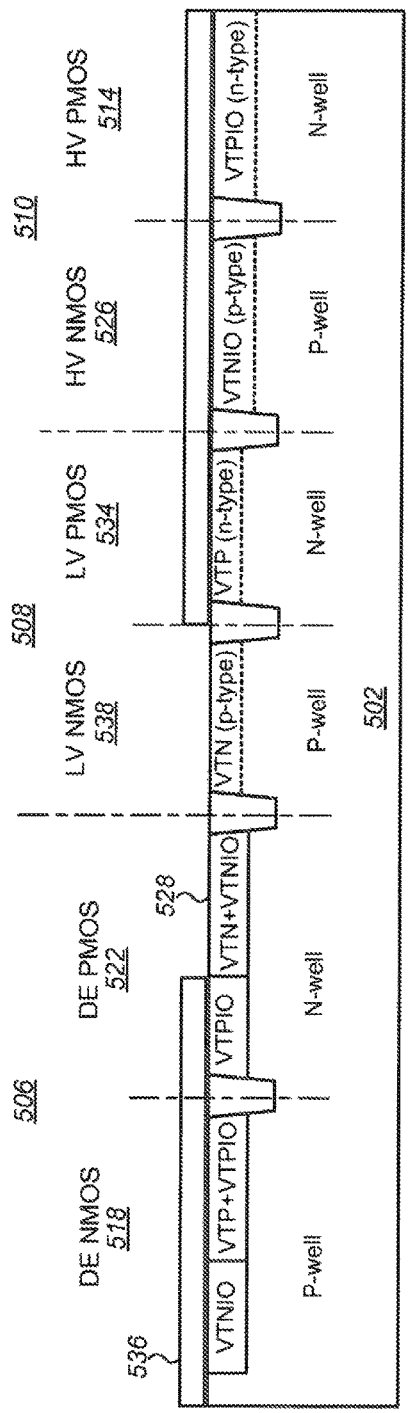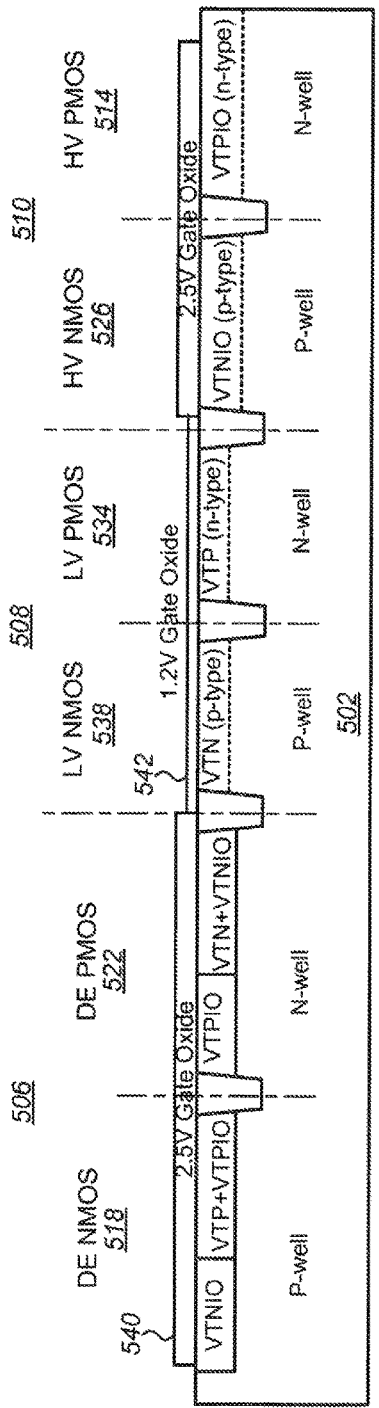

METHOD OF FORMING DRAIN EXTENDED MOS TRANSISTORS FOR HIGH VOLTAGE CIRCUITS

CROSS-REFERENCE TO RELATED APPLICATIONS

This application is a continuation of U.S. patent application Ser. No. 14/108,967 filed on Dec. 17, 2013, now U.S. Pat. No. 9,123,642, issued Sep. 1, 2015, which claims priority under 35 U.S.C. 119(e) to U.S. Provisional Patent Application Ser. No. 61/857,151, filed Jul. 22, 2013, all of which are incorporated by reference herein.

TECHNICAL FIELD

This disclosure relates generally to fabrication of semiconductor devices, and more particularly to drain extended metal-on-semiconductor (DE_MOS) transistors used in high-voltage (HV) circuits of devices such as Non-Volatile Memories (NVM) and methods for fabricating the same.

BACKGROUND

While many types of integrated circuits may be designed to operate with a single internal voltage, it is often desirable to provide an integrated circuit (IC) including devices (e.g., transistors as well as passive circuit elements) that operate at two or more different voltage levels. Examples of such ICs include a Non-Volatile Memories (NVM) and an IC including a NVM or a flash macro, such as a micro-controller, microprocessor or programmable system on a chip (PSOC). Such a circuit typically includes low-voltage metal-on-semiconductor (LV_MOS) transistors used in logic and/or switching applications and designed to operate at a voltage of less than from about 2.5 to about 3.3 volts (V), and other high-voltage metal-on-semiconductor (HV_MOS) transistors used in NVM applications such as in input/output (I/O) cells or drivers, and typically designed to operate at voltages of about 9V or greater.

A conventional approach to integrating a HV_MOS transistor into such circuit, illustrated in FIG. 1, includes introducing a thick gate oxide for the HV_MOS transistor. Referring to FIG. 1, the circuit 100 includes a LV_MOS transistor 102 formed in a first region of a substrate 104 and a HV_MOS transistor 106 formed in a second region of the substrate. Typically, the first region of the substrate 104 is separated from the second region by an isolation structure, such as a shallow-trench-isolation (STI 108). Both the LV_MOS transistor 102 and the HV_MOS transistor 106 include source (S) and drain (D) diffusion regions 110, separated by a channel 112, a gate 114 overlying the channel, and a gate oxide (such as gate oxide 116 for the LV_MOS transistor and gate oxide 118 for the HV_MOS transistor), insulating the gate from the channel. The main difference between the LV_MOS transistor 102 and the HV_MOS transistor 106, other than that a low voltage is applied to the S/D diffusion regions 110 of the LV_MOS transistor while a high voltage is applied to the S/D diffusion regions of the HV_MOS transistor, is that the gate oxide 118 for the HV_MOS transistor is much thicker, typically 1.5 to 3 times thicker than the gate oxide 116 for the LV_MOS transistor.

Another approach to integrating a HV_MOS transistor into such circuit, illustrated in FIG. 2 includes introducing a drain-extended metal-on-semiconductor (DE_MOS) transistor 200 having a reduced surface effect (RESURF) architecture. Referring to FIG. 2, a RESURF-type DE_MOS 200 typically includes in addition to a source diffusion region 202, a channel 204, a gate oxide 206, a gate 208 and a RESURF-type drain extension 210 formed in the substrate 212. The RESURF-type drain extension 210 is asymmetric with respect to the source diffusion region 202 giving the RESURF-type DE_MOS 200 a larger drain region, and adding a STI 214 between a drain HV contact 216 and the channel 204. In addition, the RESURF-type drain extension 210 is typically more lightly doped than the drain diffusion region 110 of a conventional HV_MOS transistor 106, such as that described above. Increasing the size of the RESURF-type drain extension 210, adding the STI 214 and the light doping, all serve to increase a device breakdown voltage of the DE_MOS transistor 200. Thus, the gate oxide 206 of the DE_MOS transistor 200, although often thicker than that of a LV_MOS formed elsewhere in the same circuit, is typically not as thick as the HV_MOS transistor 106 described above.

The above solutions, while an improvement over previous approaches to integrating HV and LV devices in the same circuit are not wholly satisfactory for a number of reasons including the fact that they significantly increase the number of process steps and/or device footprint. In particular, both of the above approaches require a thicker gate oxide, which it typically takes 3-5 additional mask layers to introduce in to an existing MOS process flow. These additional mask layers significantly increase production costs and time while decreasing a yield of working circuits. Moreover, the introduction of these additional mask layers is not compatible with logic/mixed mode process technologies at foundries producing 130 nm technology nodes and below, which typically require a low thermal budget and limited number of wet processing steps. Finally, with regard to the RESURF-type DE_MOS transistor 200 it is noted the inclusion of the STI 214 within the RESURF-type drain extension 210 greatly increases the footprint of the device, making this approach unsuitable for applications in which the HV_MOS is part of circuit having tight critical dimension to space (CD/space) design rules, i.e., 0.47/1.2 µm or less, making it very difficult to use these devices in pitched circuits such as an I/O cells or drivers of a NVM.

SUMMARY

In light of the above, it would be desirable to manufacture integrated circuits including drain extended metal-on-semiconductor (DE_MOS), high-voltage metal-on-semiconductor (HV_MOS) and low-voltage metal-on-semiconductor (LV_MOS) transistors compatible with logic/mixed mode CMOS process technologies. It would also be desirable to arrive at some way of forming DE_MOS and HV_MOS transistors that do not suffer from the drawbacks of the conventional approaches described above.

According to one embodiment of the present disclosure, the method includes implanting in a drain portion of a first DE_MOS transistor in a DE_MOS region of a substrate ions of a first-type at a first energy level to form the first DE_MOS transistor, and implanting in a LV_MOS region of the substrate ions of the first-type at a second energy level adjust a voltage threshold of a first LV_MOS transistor, while concurrently implanting in the drain portion of the first DE_MOS transistor ions of the first-type at the second energy level to form a drain extension of the first DE_MOS transistor.

In another embodiment, the method further includes forming a mask over the substrate exposing a part of the drain portion of the first DE_MOS transistor, and implanting ions of the first-type at a third energy level to form a graduated drain extension of the first DE_MOS transistor.

BRIEF DESCRIPTION OF THE DRAWINGS

The present disclosure is illustrated by way of example, and not by way of limitation, in the figures of the accompanying drawings.

FIGS. 3A-C are block diagrams illustrating embodiments of a high-voltage drain-extended metal-on-semiconductor (DE_MOS) transistor according to the present disclosure;

FIGS. 5A-G are block diagrams of a portion of an IC including a DE_MOS transistor illustrating a portion of the IC during a process flow for manufacturing the IC according to the method of FIG. 4;

DETAILED DESCRIPTION

Figure 1:
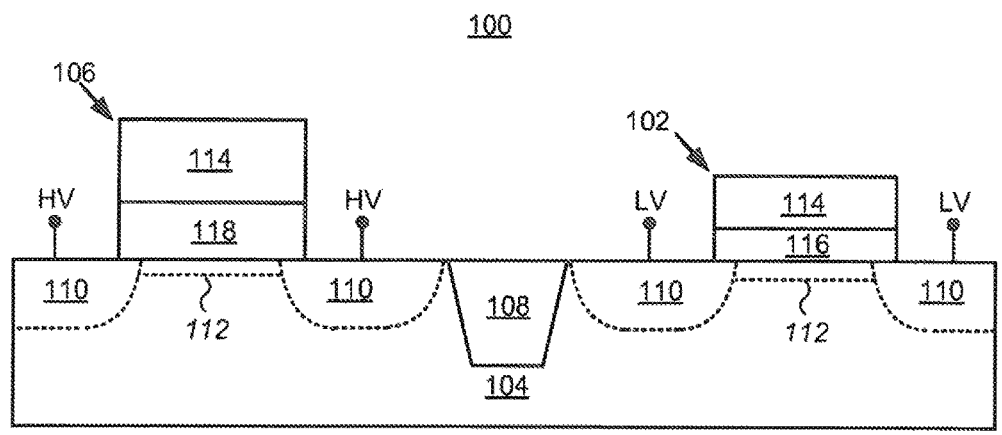
FIG. 1 (Prior Art) is a block diagram illustrating a sectional side view of a circuit including both a low-voltage metal-on-semiconductor (LV_MOS) transistor and a conventional high-voltage metal-on-semiconductor (HV_MOS) transistor including a thick gate oxide.
Figure 2:
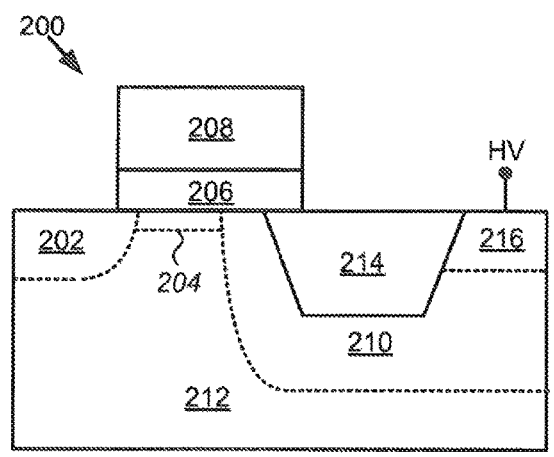
FIG. 2 (Prior Art) is a block diagram illustrating a sectional side view of a conventional drain-extended metal-on-semiconductor (DE_MOS) transistor including a RESURF-type drain extension.

Various embodiments of the present invention will now be described with reference to a number of diagrams. The embodiments include methods of concurrently forming a high-voltage drain-extended metal-on-semiconductor (DE_MOS) transistor, as well as a low-voltage metal-on-semiconductor (LV_MOS) and high-voltage metal-on-semiconductor (HV_MOS) transistors in a number of different circuits and applications. In particular embodiments, the DE_MOS transistor may be formed in the same substrate as a LV_MOS transistor in an input/output (I/O) cell in a non-volatile memory (NVM), or in a driver for the NVM.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term to couple as used herein may include both to directly electrically connect two or more components or elements and to indirectly connect through one or more intervening components.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Embodiments of a high-voltage drain-extended metal-on-semiconductor (DE_MOS) transistor according to the present disclosure will now be described with reference to FIGS. 3A-C.

Referring to FIG. 3A in a first embodiment, the DE_MOS transistor 302 is a first or N-type DE_MOS transistor (DE NMOS), formed in a P-well 304 of a substrate 306, having a N+ doped source portion or source 308 and a N+ doped drain 310 separated by a channel 312, and a gate 314 and a gate dielectric or gate oxide 316, overlying the channel. In accordance with the present disclosure the DE_MOS transistor 302 further includes a N-drain extension 318 separating the channel 312 from the N+ doped drain 310. Generally, the N-drain extension 318 comprises an implant or dopant concentration that is lighter than that of the N+ doped drain 310. In some embodiments, such as that shown, the N-drain extension 318 has implant or dopant concentration substantially equal to at least a sum of a voltage threshold adjust implant (VTP) of a first low-voltage metal-on-semiconductor (LV_MOS) transistor (not shown in this figure) formed concurrently elsewhere on the same substrate, and voltage threshold adjust implant (VTPIO) of a non-drain extended, first high-voltage metal-on-semiconductor (HV_MOS) (not shown in this figure) such as input/output (I/O) transistor, formed concurrently elsewhere on the same substrate. It will be understood that the first LV_MOS transistor and first HV_MOS transistor are of the opposite type of the N-type DE_MOS or (DE_NMOS). That is the first LV_MOS transistor is a LV_PMOS and the first HV_MOS transistor a HV_PMOS.

In one very particular example, a suitable VTP implant may include low energy ions implanted at a dose in the range of $10^{12}$ to $10^{14}$ ions/cm$^2$. Implant energies may be in the range of about 40-60 keV. A suitable VTPIO implant may include high energy ions implanted at a dose in the range of $10^{12}$ to $10^{13}$ ions/cm$^2$, at implant energies in the range of about 60-150 keV. Implanted ions to form the N-drain extension 318 of a DE_MOS may include the Arsenic or Phosphorus species.

Referring to FIG. 3A it is noted that the gate oxide 316 includes an oxide layer having a thickness of from about 50 Å to about 65 Å, greater than that used in the LV_MOS transistor, but substantially less than the thickness used in conventional HV_MOS transistors. It is further noted the N-drain extension 318 extends from the channel 312 a length or distance of from about 0.5 um to about 0.9 um.

Finally, FIG. 3B illustrates a planar, top view of the DE_MOS transistor of FIG. 3A. Referring to FIGS. 3A and 3B it is noted that that the N-drain extension 318 does not include any shallow-trench-isolation structure (STI) such as used in a conventional, reduced surface effect (RESURF) type a drain-extended metal-on-semiconductor (DE_MOS) transistor.

In a second embodiment shown in FIG. 3C the DE_MOS transistor 320 is a second or P-type DE_MOS transistor (DE_PMOS), formed in a N-well 322 of the substrate 306, having a P+ doped source portion or source 324 and a P+ doped drain 326 separated by a channel 328, a gate 330 and a gate dielectric or oxide 332, overlying the channel. The P-type DE_MOS transistor (DE_PMOS) can be formed in the same substrate as the N-type DE_MOS transistor 302 (DE_NMOS), as in the embodiment shown, or in a separate substrate.

In accordance with the present disclosure the DE_MOS transistor 320 further includes a P-drain extension 334 separating the channel 328 from the P+ doped drain 326. Generally, the P-drain extension 334 comprises an implant or dopant concentration that is lighter than that of the P+ doped drain 326. In some embodiments, such as that shown, the P-drain extension 334 has implant or dopant concentration substantially equal to at least a sum of a voltage threshold adjust implant (VTN) of a second LV_MOS transistor (not shown in this figure) formed concurrently elsewhere on the same substrate, and voltage threshold adjust implant (VTNIO) of a non-drain extended, second HV_MOS transistor (not shown in this figure) such as I/O transistor, formed concurrently elsewhere on the same substrate. It will be understood that the second LV_MOS transistor and second HV_MOS transistor are of the opposite type of both the P-type DE_MOS or (DE_PMOS) and the first LV_MOS transistor and first HV_MOS transistor described above with respect to FIG. 3A.

In one very particular example, a suitable VTN implant may include low energy ions implanted at a dose in the range of $10^{12}$ to $10^{14}$ ions/cm$^2$. Implant energies may be in the range of about 20-30 keV. A suitable VTNIO implant may include high energy ions may be implanted at a dose in the range of $10^{12}$ to $10^{13}$ ions/cm$^2$, at implant energies in the range of about 30-70 keV. Implanted ions to form the P-drain extension 334 of a DE_PMOS may include the BF$_2$ or Boron$^{11}$ species.

An embodiment of a process or method for manufacturing an IC including an LV_MOS transistor, HV_MOS transistor and a DE_MOS transistor according to an embodiment of the present disclosure will now be described in detail with reference to FIG. 4 and FIGS. 5A through 5G.

To simplify understanding of the method for manufacturing an IC including an LV_MOS transistor, HV_MOS transistor and an DE_MOS transistor, the surface of a substrate 502 is divided into three different regions including a DE_MOS region 506 in which one or more DE_MOS transistors will be formed, a LV_MOS region 508 in which one or more LV_MOS transistors will be formed and a HV_MOS region 510 in which one or more HV_MOS transistors will be formed. In the embodiment shown, each of the DE_MOS region 506, the LV_MOS region 508 and the HV_MOS region 510 include one P-well and one N-well in which different types of MOS transistors, either PMOS or NMOS will be formed.

Figure 4:
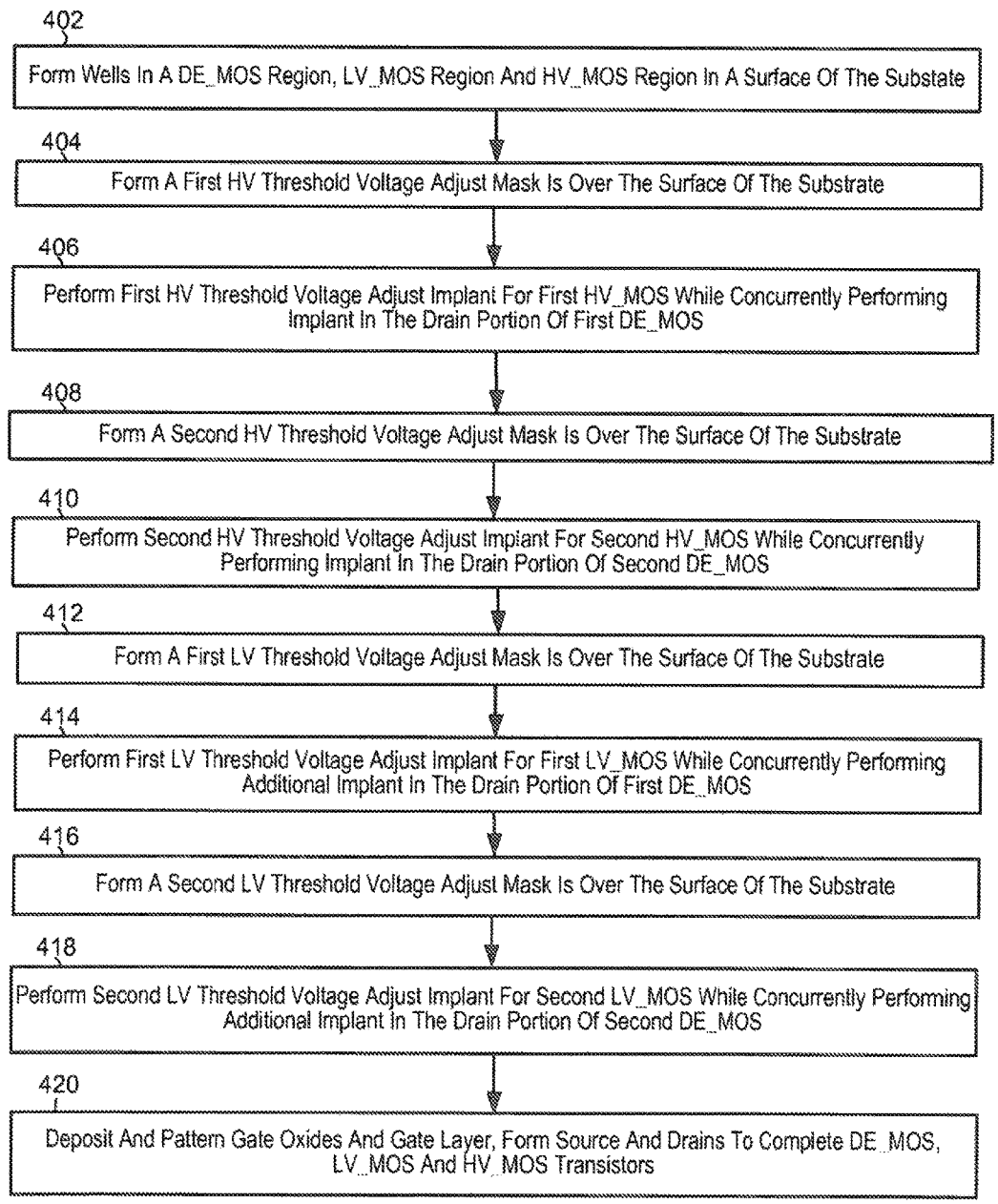
FIG. 4 is a flowchart of an embodiment of a process or method for manufacturing an integrated circuit (IC) including DE_MOS transistor according to an embodiment of the present disclosure.

Referring to FIG. 4 and FIG. 5A, the process begins with forming N-wells and P-wells in a surface of the substrate 502, each of the N-wells and P-wells isolated from one another at substrate surface by shallow-trench-isolation structures 504 (step 402).

Referring to FIGS. 4 and 5B a first HV threshold voltage adjust mask 512 is formed over the surface of the substrate to expose a N-well in the HV_MOS 510 region in which a first HV_MOS transistor (HV_PMOS 514) is to be formed, and to expose a drain portion 516 in a P-well in the DE_MOS region in which a first DE_MOS transistor (DE_NMOS 518) is to be formed (step 404). Next, referring to FIG. 4 a first HV threshold voltage adjust implant (VTPIO) is performed to implant ions of a first-type at a first energy level in the N-well in the HV_MOS region to adjust a voltage threshold of the HV_PMOS 514, while concurrently implanting ions of the first-type at the first energy level in the drain portion 516 of the DE_NMOS 518 (step 406). Optionally, as shown in FIG. 5B the masking step (step 404) and the first threshold voltage adjust implant step (step 406) further include exposing a source and channel portion 520 in a N-well in the DE_MOS region 506 in which a second DE_MOS transistor (DE_PMOS 522) is to be formed to form the source and channel portion of the DE_PMOS.

Referring to FIGS. 4 and 5C a second HV threshold voltage adjust mask 524 is formed over the surface of the substrate to expose the P-well in the HV_MOS 510 region in which a second HV_MOS transistor (HV_NMOS 526) is to be formed, and to expose a drain portion 528 in the-well in the DE_MOS region 506 in which the second DE_MOS transistor (DE_PMOS 522) is to be formed (step 408). Next, referring to FIG. 4 a second HV threshold voltage adjust implant (VTNIO) is performed to implant ions of a second-type at the first energy level in the P-well in the HV_MOS region to adjust a voltage threshold of the HV_NMOS 526, while concurrently implanting ions of the second-type at the first energy level in the drain portion 528 of the DE_PMOS 522 (step 410). Optionally, as shown in FIG. 5C the masking step, step 408, and the second threshold voltage adjust implant step, step 410, further include exposing a source and channel portion 530 in the P-well in the DE_MOS region 506 in which the first DE_MOS transistor (DE_NMOS 518) is to be formed to form the source and channel portion of the DE_NMOS.

Referring to FIGS. 4 and 5D, a first LV threshold voltage adjust mask 532 is formed over the surface of the substrate 502 to expose a N-well in the LV_MOS region 508 in which a first LV_MOS transistor (LV_PMOS 534) is to be formed, and to expose a drain portion 516 in the P-well in the DE_MOS region 506 in which the first DE_MOS transistor (DE_NMOS 518) is to be formed (step 412). Next, referring to FIG. 4 a first LV threshold voltage adjust implant (VTP) is performed to implant ions of the first-type at a second energy level in the N-well in the LV_MOS region 508 to adjust a voltage threshold of the LV_PMOS 534, while concurrently implanting additional ions of the first-type at the second energy level in the drain portion 516 of the DE_NMOS 518 (step 414).

Referring to FIGS. 4 and 5E, a second LV threshold voltage adjust mask 536 is formed over the surface of the substrate to expose a P-well in the LV_MOS region 508 in which a second LV_MOS transistor (LV_NMOS 538) is to be formed, and to expose the drain portion 528 in the N-well in the DE_MOS region 506 in which the first DE_MOS transistor (DE_PMOS 522) is to be formed (step 416). Next, referring to FIG. 4 a second LV threshold voltage adjust implant (VTN) is performed to implant ions of the second-type at the second energy level in the P-well in the LV_MOS region 508 to adjust a voltage threshold of the LV_NMOS 538, while concurrently implanting additional ions of the second-type at the second energy level in the drain portion 528 of the DE_PMOS 522 (step 418).

Figure 5G:
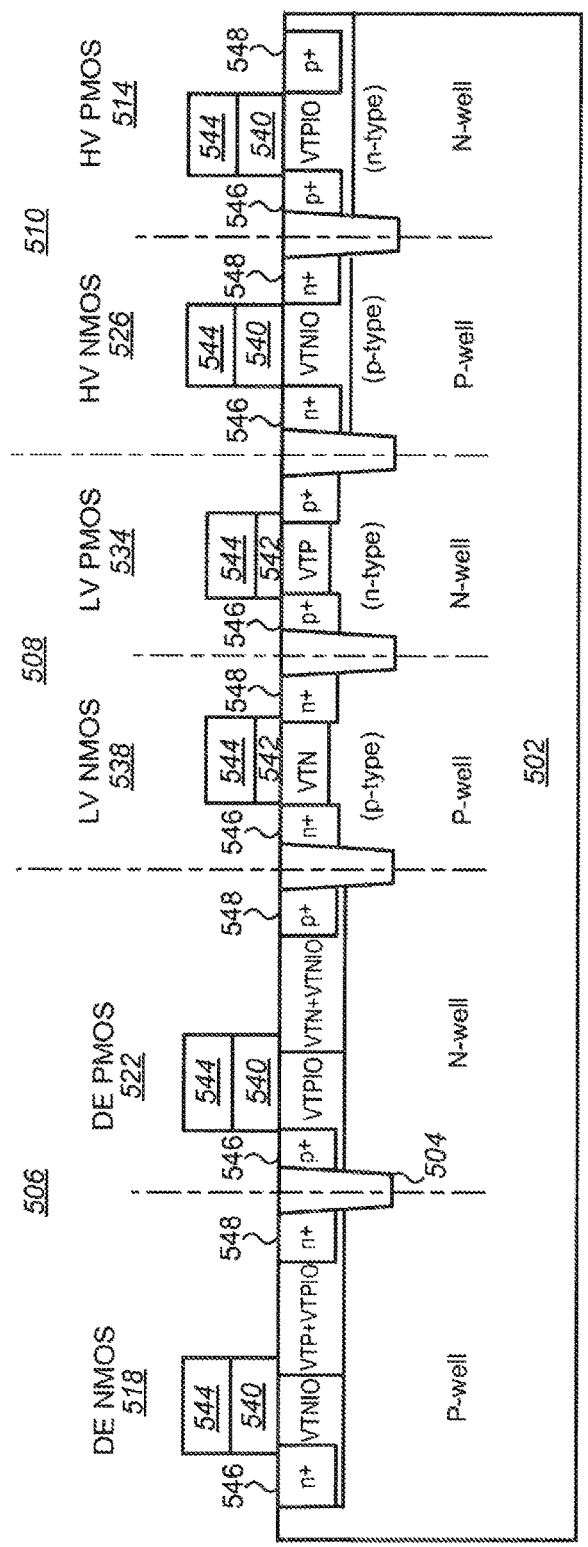

Referring to FIG. 4 and FIGS. 5F and 5G, first and second gate oxides 540, 542, and a gate layer 544 are deposited and patterned, and sources 546 and drains 548 formed. Gate oxides 540, 542, can be deposited to any desired thickness using standard oxide deposition techniques, including in-situ-steam-generation (ISSG) and thermal oxidation. Referring to FIG. 5F it is noted that the gate oxide 540 includes an oxide layer having a thickness of from about 50 Å to about 65 Å, greater than the gate oxide 542 used in the LV_MOS transistor, but substantially less than the thickness used in conventional HV_MOS transistors designed for operation at 9V or higher voltage.

Gate layer 544 generally includes poly-silicon, titanium nitride (TiN), tantalum nitride (TaN), tungsten (W), aluminum, copper or alloys or mixtures thereof, and is deposited by physical vapor deposition, such as sputtering, evaporation, or electroless plating to a thickness of from about 500 to about 3000 Å. The gate layer 544 and gate oxides 540, 542 are then patterned to form the gate stacks illustrated in FIG. 5G using standard photolithographic and metal and oxide etching techniques, including for example, a high density plasma (HDP) etching, and various post-metal etch cleaning processes to prevent corrosion defects.

The sources 546 and drains 548 can be formed by ion implantation to complete all DE_MOS, LV_MOS and HV_MOS transistors.

It will be understood by those skilled in the art that the embodiment of a process or method of manufacturing or fabricating an IC including DE_MOS, LV_MOS and HV_MOS transistors described above advantageously minimizes changes to the standard complimentary metal-oxide-semiconductor (CMOS) process flow, including just modifications of existing LV and HV threshold voltage adjust masks to form a DE_MOS transistor in a mixed mode circuit. By eliminating the need for additional mask layers typically required with thicker oxides production costs and time are significantly decreased while a yield of working circuits increased. It will further be understood that the DE_MOS transistor fabricated by the disclosed method minimizes the footprint of the device, making this approach particular well suited for applications in which the DE_MOS transistor is part of circuit having tight critical dimension to space (CD/space) design rules, i.e., 0.47/1.2 um or less, making it very useful in pitched circuits such as an I/O cells or NVM array in a non-volatile macro circuit.

Figure 6:
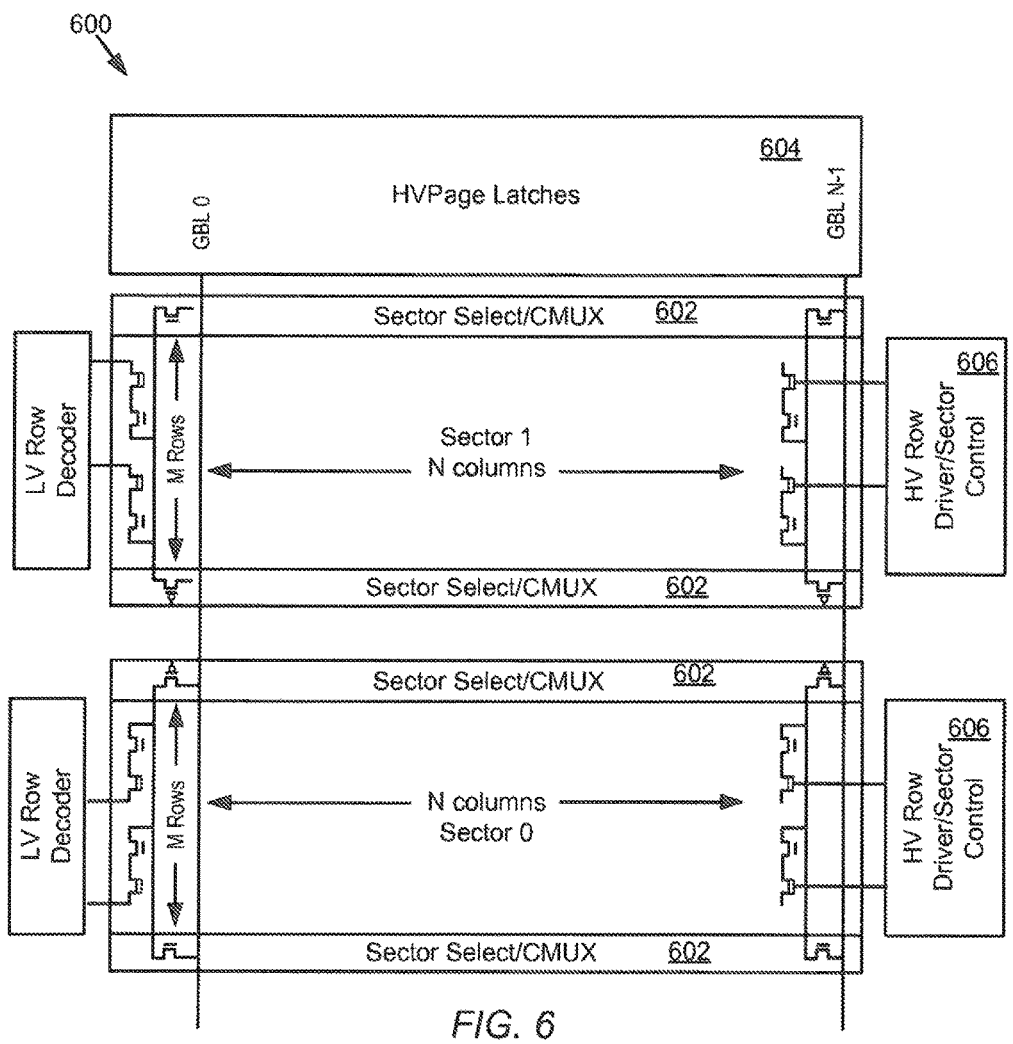
FIG. 6 is a block diagram of a flash macro illustrating applications for a DE_MOS transistor according to embodiments of the present disclosure.

FIG. 6 is a block diagram of a flash macro 600 illustrating applications for a DE_MOS transistors according to embodiments of the present disclosure. Referring to FIG. 6, it is noted that high voltage DE_MOS transistors can be used in at least three separate sub-circuits. In particular, it has been found that HV capabilities of the DE-MOS transistors can be advantageously used in HV sector select/CMUXs 602, in HV page latches 604 and in HV row drivers 606.

Figure 7:
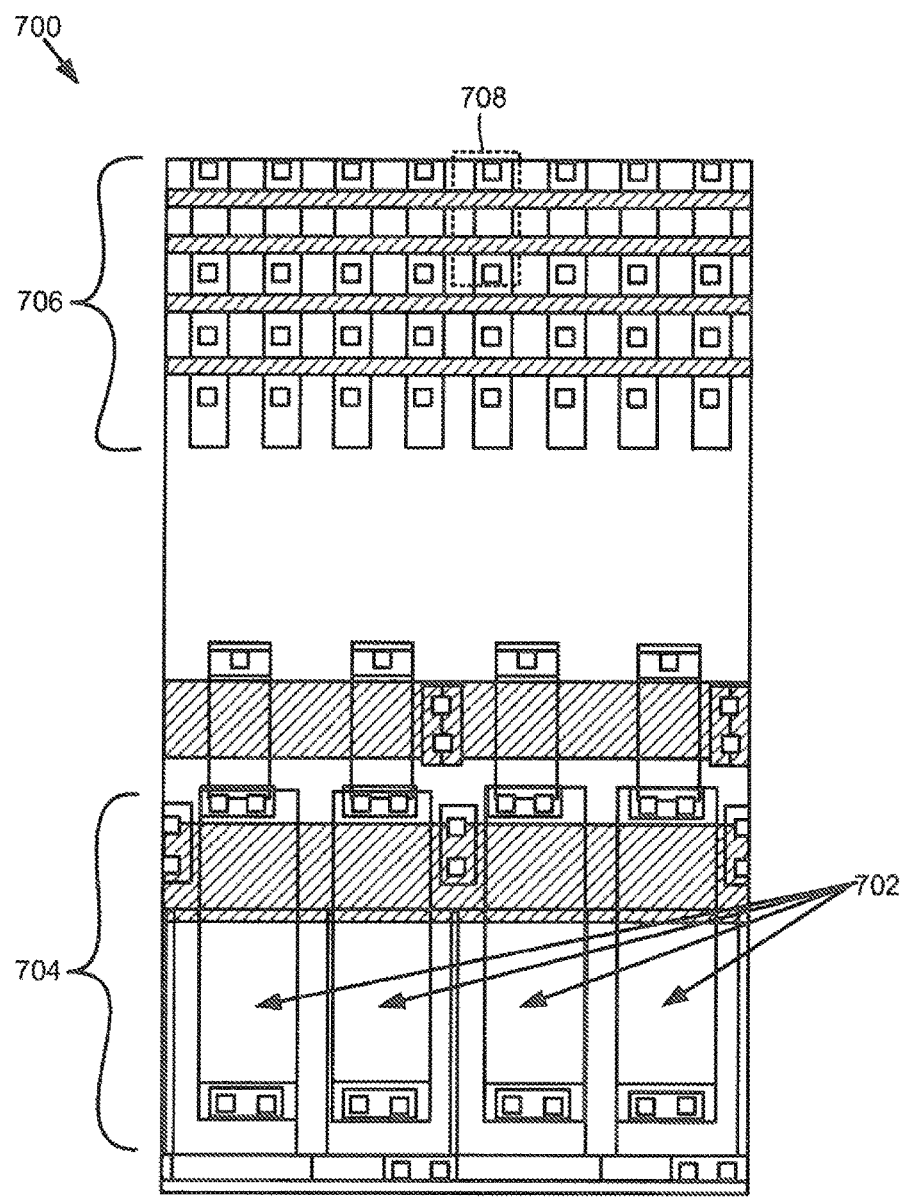
FIG. 7 is a block diagram of a portion of a NVM illustrating applications for a DE_MOS transistor in both a memory array and a bit line driver according to embodiments of the present disclosure.

FIG. 7 is a layout of a portion of a NVM 700 illustrating applications for a DE_MOS transistor 702 according to embodiments of the present disclosure in a bit line driver 704. The bit line driver 704 is laid out on-pitch with a memory array 706 including a plurality of cells 708.

Figure 8B:
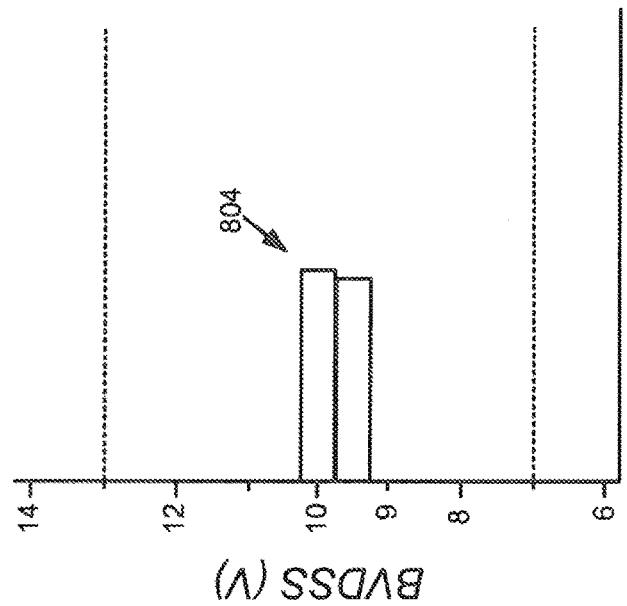
FIGS. 8A and 8B are plots illustrating a drain-to-source breakdown voltage (BVDS) for DE_MOS transistors fabricated according to the present disclosure.
Figure 8A:
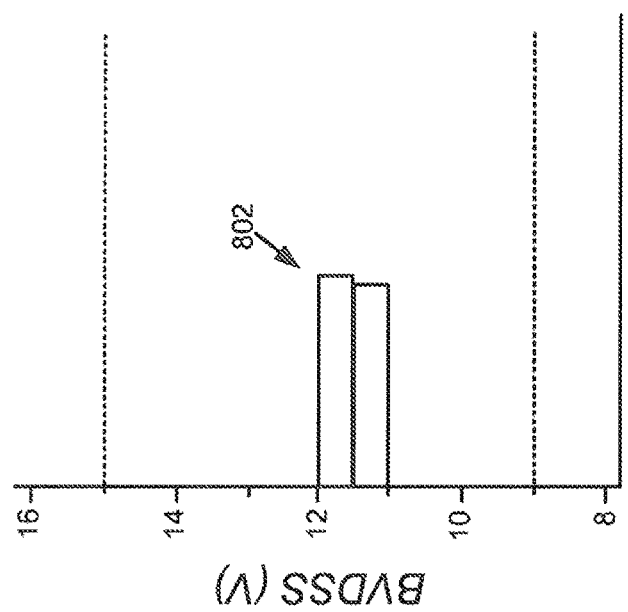

FIGS. 8A and 8B are plots illustrating a drain-to-source breakdown voltage (BVDS) distributions for DE_MOS transistors fabricated according to the present disclosure. FIG. 8A illustrates the BVDSS distribution 802 for a DE NMOS. Referring to FIG. 8A it is seen that the BVDSS distribution 802 has been increased to be centered at 11.4V. Referring to FIG. 8B it is seen that BVDSS distribution 804 for a DE PMOS has been increased to be centered at 9.9V.

Figure 8C:
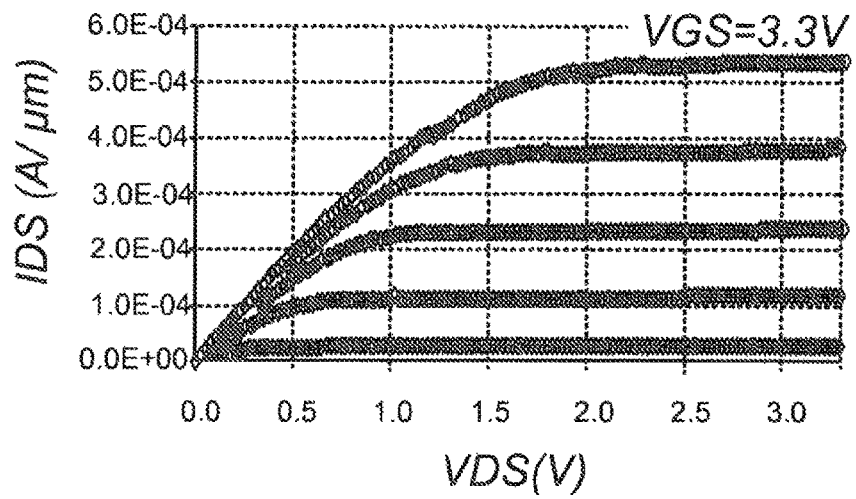
FIG. 8C is a plot of drain-to-source current versus drain-to-source voltage (IDS-VDS) for a DE_NMOS transistor fabricated according to the present disclosure.

FIG. 8C shows drain-to-source current versus drain-to-source voltage (IDS-VDS) for a DE_NMOS transistor fabricated according to the present disclosure with a BVDSS distribution centered at 11.4V. Referring to FIG. 8C it is seen that at VGS=VDS=3.3V, DE NMOS delivers IDS of 530 uA/um, typical for NMOS transistors. This high drive capability coupled with the high BVDSS of 11.4V enable efficient use of the DE NMOS devices in HV driver circuits. The IDS-VDS for a DE_PMOS transistor fabricated according to the present disclosure exhibit similar improvements.

Figure 9:
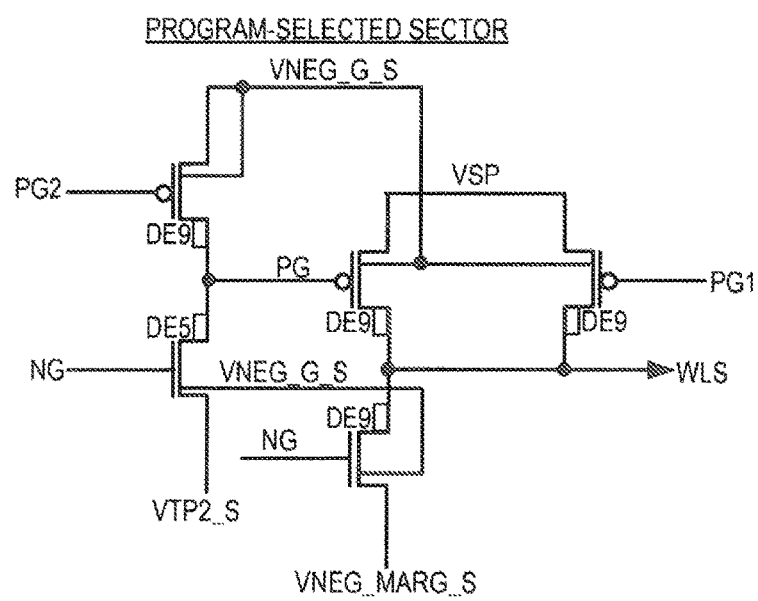
FIG. 9 is a schematic diagram of a driver including DE_MOS transistors and illustrating the elimination of cascoding due to the high BVDS of the DE_MOS transistor fabricated according to the present disclosure.

FIG. 9 is a schematic diagrams of HV row driver circuit containing N-type MOS (NMOS) and P-type MOS (PMOS) drivers illustrating the elimination of cascoding due to the high BVDS of DE_MOS transistor fabricated according to the present disclosure.

Alternative Embodiments

Embodiments of a DE_MOS transistor including a graduated drain extension and methods of forming the same according to the present disclosure will now be described with reference to FIGS. 10A-10D.

In an alternative embodiment, the method further includes forming a DE_MOS transistor having a graduated drain extension to improve "on"-state resistance and/or safe operating area of the DE_MOS transistor.

Figure 10A:
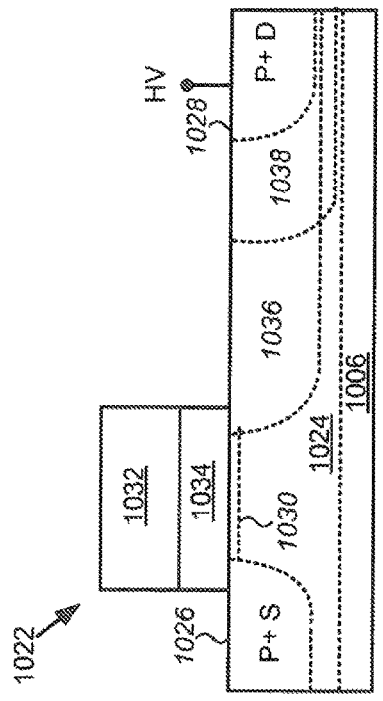
FIGS. 10A-D are block diagrams illustrating embodiments of DE_MOS transistors fabricated according to another embodiment of the present disclosure.

Referring to FIG. 10A in a first embodiment the DE_MOS transistor 1002 is a first or N-type DE_MOS transistor (DE NMOS), formed in a P-well 1004 of a substrate 1006, having a N+ doped source 1008 and a N+ doped drain 1010 separated by a channel 1012, a gate 1014 and a gate dielectric or oxide 1016, overlying the channel and a N-drain extension 1018 separating the channel 1012 from the N+ doped drain 1010. As described above, the N-drain extension 1018 comprises an implant or dopant concentration substantially equal to at least a sum of a threshold voltage adjust implant (VTP) of a first low-voltage metal-on-semiconductor (LV_MOS) transistor (not shown in this figure) formed concurrently elsewhere on the same substrate, and threshold voltage adjust implant (VTPIO) of a non-drain extended, first high-voltage metal-on-semiconductor (HV_MOS) (not shown in this figure) such as input/output (I/O) transistor, formed concurrently elsewhere on the same substrate.

In accordance with the present embodiment the DE_MOS transistor 1002 further includes an additional implant 1020 in the N-drain extension 1018. The addition of this additional implant 1020 to the drain extension to improve the "on" resistance and/or expand safe operating area (SOA) of the DE_MOS transistor.

Figure 10C:
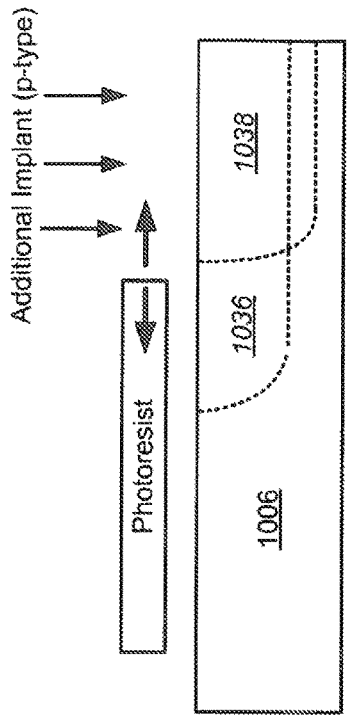
Figure 10B:
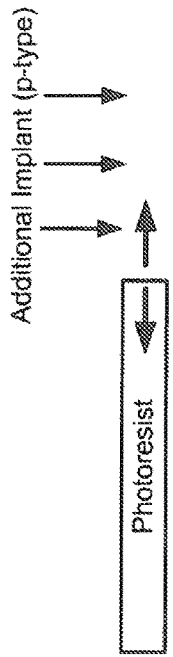

Referring to FIG. 10B, the additional implant 1020 can be performed by depositing and patterning a photoresist (PR) mask on the surface of the substrate 1006 to expose a portion of the N-drain extension 1018 followed by implanting additional ions of the appropriate type, i.e., N-type, at a suitable dose, and energy level. In one very particular example, a suitable additional implant 1020 may include high energy ions implanted at a dose in the range of $10^{12}$ to $10^{14}$ ions/cm$^2$. Implant energies may be in the range of about 30-100 keV. Implanted ions to form the additional implant 1020 of the DE_NMOS 1002 may include the Phosphorus or Arsenic species.

As indicated by horizontal arrows in FIG. 10B, the implant mask size or location can be selected to scale the size of the additional implant 1020 depending on operation requirements of the DE_MOS transistor 1002.

In a second embodiment shown in FIG. 10C the DE_MOS transistor 1022 is a second or P-type DE_MOS transistor (DE_PMOS), formed in a N-well 1024 of the substrate 1006, having a P+ doped source 1026 and a P+ doped drain 1028 separated by a channel 1030, a gate 1032 and a gate dielectric or oxide 1034, overlying the channel.

In accordance with the present disclosure the DE_MOS transistor 1022 further includes, in addition to a P-drain extension 1036 separating the channel 1030 from the P+ doped drain 1028, an additional implant 1038 in the P-drain extension 1036 to improve the "on" resistance and/or expand safe operating area (SOA) of the DE_MOS transistor.

Figure 10D:
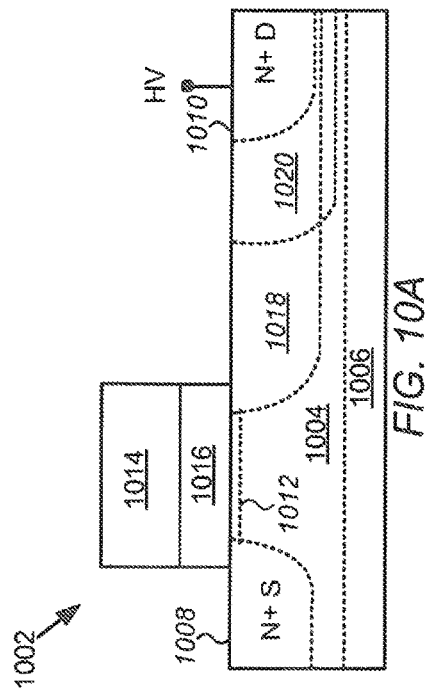

Referring to FIG. 10D, as with the DE_NMOS transistor 1002 the additional implant 1038 can be performed by depositing and patterning a photoresist (PR) mask on the surface the of substrate 1006 to expose a portion of the P-drain extension 1036 followed by implanting additional ions of the appropriate type, i.e., P-type, at a suitable dose, and energy level. Generally, the additional implant 1038 of the P-drain extension 1036 generally includes an implant or dopant concentration that is lighter than that of the P+ doped drain 1028. In one very particular example, a suitable additional implant 1038 may include low energy ions implanted at a dose in the range of $10^{12}$ to $10^{14}$ ions/cm$^2$. Implant energies may be in the range of about 20-50 keV. Implanted ions to form the P-drain extension 1036 may include the $BF_2$ or Boron$^{11}$ species.

Thus, embodiments of mixed mode integrated circuits and in particular of non-volatile memories including both DE_MOS and LV_MOS transistors and methods of manufacturing the same have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A method comprising:
    implanting a first type of ions at a first energy level in a first drain portion of a first drain extended metal-on-semiconductor (DE_MOS) transistor in a DE_MOS region of a substrate;
    implanting the first type of ions at the first energy level in a low-voltage metal-on-semiconductor (LV_MOS) region of the substrate, the LV_MOS region being located where a first LV_MOS transistor is to be formed, the implanting of the first type of ions in the LV_MOS region adjusting a voltage threshold of the first LV_MOS transistor, and the implanting of the first type of ions the first drain portion being concurrent with the implanting of the first type of ions in the LV_MOS region, wherein the first DE_MOS transistor and the first LV_MOS transistor are of an opposite type of transistors;
    implanting the first type of ions at a second energy level in the first drain portion of the first DE_MOS transistor; and
    subsequent to implanting the first type of ions at the second energy level in the first drain portion of the first DE_MOS transistor, forming a gate oxide of the first DE_MOS transistor.

2. The method of claim 1, further comprising: implanting the first type of ions at the second energy level in a high-voltage metal-on-semiconductor (HV_MOS) region of the substrate where a first HV_MOS transistor is to be formed, the implanting of the first, type of ions in the HV_MOS region adjusting a voltage threshold of the first HV_MOS transistor.

3. The method of claim 1, wherein the implanting of the first type of ions at the second energy level in the first drain portion of the first DE_MOS transistor is concurrent with the implanting of the first type of ions at the second energy level in the HV_MOS region.

4. The method of claim 1 further comprising:
    implanting a second type of ions at the first energy level in the LV_MOS region; and
    implanting the second type of ions at the first energy level in a second drain portion of a second DE_MOS transistor.

5. The method of claim 4 further comprising:
    implanting the second type of ions at the second energy level in the HV_MOS region; and
    implanting the second type of ions at the second energy level in the second drain portion of the second DE_MOS transistor.

6. The method of claim 5 further comprising:
    wherein the implanting of e second type of ions at the first energy level in the LV_MOS region is concurrent with the implanting of the second type of ions at the first energy level in the second drain portion of the second DE_MOS transistor, and
    wherein the implanting of the second type of ions at the second energy level in the HV_MOS region is concurrent with the implanting of the second type of ions at the second energy level in the second drain portion of the second DE_MOS transistor.

7. The method of claim 6, wherein the first energy level is lower than the second energy level.

8. The method of claim 1, wherein the first DE_MOS transistor formed is in an input/output (I/O) cell of a non-volatile memory (NVM).

9. The method of claim 1, wherein the first DE_MOS transistor formed is on pitch with a non-volatile memory (NVM) array of an NVM device.

10. A method comprising:
forming a first low-voltage (LV) threshold voltage adjust mask over a surface of a substrate to expose a first portion of a low-voltage metal-on-semiconductor (LV_MOS) region of the substrate, and to expose a first portion of a drain extended metal-on-semiconductor (DE_MOS) region where a first DE_MOS transistor is to be formed;
implanting a first type of ions at a first energy level in the first portion of the DE_MOS region of the substrate;
implanting the first type of ions at the first energy level in the first portion of the LV_MOS region, the first portion of the LV_MOS region being located at where a first LV_MOS transistor is to be formed, the implanting of the first type of ions in the first LV_MOS region adjusting a voltage threshold of the first LV_MOS transistor, and the implanting of the first type of ions in the first portion of the DE_MOS region being concurrent with the implanting of the first type of ions in the first portion of the LV_MOS region, wherein the first DE_MOS transistor and the first LV_MOS transistor are of an opposite type of transistors; and
forming a second LV threshold voltage adjust mask over the surface of the substrate to expose a second portion of the LV_MOS region of the substrate, and to expose a second portion of the DE_MOS region.

11. The method of claim 10 further comprising:
implanting a second type of ions at the first energy level in the LV_MOS region; and
implanting the second type of ions at the first energy level in the second portion of the DE_MOS region, wherein the implanting of the second type of ions at the first energy level the LV_MOS region is concurrent with the implanting of the second type of ions at the first energy level in the second portion of the DE MOS region.

12. The method of claim 11 further comprising:
forming a first high voltage (HV) threshold voltage adjust mask over the surface of the substrate to expose a first portion of a high-voltage metal-on-semiconductor (HV_MOS) region of the substrate, and to expose the first portion of the DE_MOS region;
implanting the first type of ions at a second energy level in the first portion of the HV_MOS region of the substrate where a first HV_MOS transistor is to be formed, the implanting of the first type of ions in the first portion of the HV_MOS region adjusting a voltage threshold of the first HV_MOS transistor; and
implanting the first type of ions at the second energy level in the first portion of the DE_MOS region, wherein the implanting of the first type of ions at the second energy level in the first portion of the DE_MOS region is concurrent with the implanting of the first type of ions at the second energy level in the first portion of the HV_MOS region.

13. The method of claim 12 further comprising:
forming a second high voltage (HV) threshold voltage adjust mask over the surface of the substrate to expose a second portion of the HV_MOS region, and to expose the second portion of the DE_MOS region;
implanting the second type of ions at the second energy level in the second portion of the HV_MOS region; and
implanting the second type of ions at the second energy level in the second portion of the DE_MOS region, wherein the implanting of the second type of ions at the second energy level in the second portion of the HV_MOS region is concurrent with the implanting of the second type of ions at the second energy level in the second portion of the DE_MOS region.

14. A method comprising:
implanting a first type of ions at a first energy level in a first drain portion of a first drain extended metal-on-semiconductor (DE_MOS) transistor in a DE_MOS region of a substrate;
implanting the first type of ions at a first energy level in a low-voltage metal-on-semiconductor (LV_MOS) region of the substrate, the LV_MOS region being located where a first LV_MOS transistor is to be formed, the implanting of the first type of ions in the LV_MOS region adjusting a voltage threshold of the first LV_MOS transistor, and the implanting of the first type of ion the first drain portion of the first DE_MOS transistor being cone t with the implanting of the first type of ions in the LV_MOS region, wherein the first DE_MOS and first LV_MOS transistors are of an opposite type of transistors;
implanting the first type of ions at a second energy level in a high-voltage metal-on-semiconductor (HV_MOS) region of the substrate where the first HV_MOS transistor is to be formed, the implanting of the first type of ions in the HV_MOS region adjusting a voltage threshold of the first HV_MOS transistor; and
implanting the first type of ions at the second energy level in the first drain portion of the first DE_MOS transistor; and
subsequent implanting the first type of ions at the second energy level in the first drain portion of the first DE_MOS transistor, forming a first gate oxide for the first DE_MOS transistor while concurrently forming a second gate oxide for the first HV_MOS transistor.

15. The method of claim 14, wherein the implanting of the first type of ions at the second energy level in the first drain portion of the first DE_MOS transistor is concurrent with the implanting of the first type of ions at the second energy level in the HV_MOS region.

16. The method of claim 14, wherein the first gate oxide and the second gate oxide have a thickness greater than a thickness of a third gate oxide associated with the LV_MOS region.

17. The method of claim 14, wherein the first gate oxide and the second gate oxide each have a thickness of between about 50 Å to 65 Å.

* * * * *